US012701841B2

(12) United States Patent
Peng et al.

(10) Patent No.: US 12,701,841 B2
(45) Date of Patent: Aug. 4, 2026

(54) LIGHT-EMITTING DEVICE AND METHOD FOR MANUFACTURING THE SAME

(71) Applicant: AUO Corporation, Hsinchu (TW)

(72) Inventors: Chung En Peng, Hsinchu (TW);
Chin-Ying Liu, Hsinchu (TW)

(73) Assignee: AUO Corporation, Hsinchu (TW)

( * ) Notice: Subject to any disclaimer, the term of this patent is extended or adjusted under 35 U.S.C. 154(b) by 495 days.

(21) Appl. No.: 18/336,035

(22) Filed: Jun. 16, 2023

(65) Prior Publication Data

US 2024/0266487 A1     Aug. 8, 2024

(30) Foreign Application Priority Data

Feb. 8, 2023    (TW) ................................. 112104373
May 15, 2023    (TW) ................................. 112117876

(51) Int. Cl.
*H10H 20/857*         (2025.01)
*G09G 3/00*           (2006.01)
*H10W 90/00*          (2026.01)
*H10H 20/01*          (2025.01)

(52) U.S. Cl.
CPC ........... *H10H 20/857* (2025.01); *G09G 3/006* (2013.01); *H10W 90/00* (2026.01); *G09G 2330/12* (2013.01); *H10H 20/0364* (2025.01)

(58) Field of Classification Search
CPC .. H10H 20/857; H10H 20/0364; H10H 20/01; G09G 3/006; G09G 2330/12; H01L 25/0753; H10W 90/00
See application file for complete search history.

(56) References Cited

U.S. PATENT DOCUMENTS

| | | | |
|---|---|---|---|
| 11,508,704 B2 | 11/2022 | Chae et al. | |
| 11,955,506 B2 | 4/2024 | Lin et al. | |
| 2013/0280904 A1* | 10/2013 | Shi ......................... | H01L 21/78 |
| | | | 438/613 |
| 2018/0019234 A1* | 1/2018 | Hu ........................ | H01L 25/167 |
| 2021/0183828 A1 | 6/2021 | Chae et al. | |
| 2022/0028924 A1 | 1/2022 | Lin et al. | |

(Continued)

FOREIGN PATENT DOCUMENTS

| | | |
|---|---|---|
| CN | 103296153 | 9/2013 |
| CN | 103811631 | 5/2014 |

(Continued)

*Primary Examiner* — Ratisha Mehta
(74) *Attorney, Agent, or Firm* — JCIPRNET

(57) ABSTRACT

A light-emitting device includes a circuit substrate; a plurality of light-emitting elements disposed over the circuit substrate; a plurality of metal patterns disposed between the plurality of light-emitting elements and the circuit substrate respectively; a plurality of connectors disposed between the plurality of light-emitting elements and the plurality of metal patterns respectively; and a plurality of eutectic patterns disposed between the plurality of light-emitting elements and the plurality of connectors respectively, wherein a first spacing exists between a first light-emitting element of the plurality of light-emitting elements and the circuit substrate, a second spacing exists between a second light-emitting element of the plurality of light-emitting elements and the circuit substrate, and a difference between the first spacing and the second spacing is equal to a thickness of the eutectic pattern.

12 Claims, 8 Drawing Sheets

(56)            References Cited

U.S. PATENT DOCUMENTS

| | | | |
|---|---|---|---|
| 2022/0029051 A1 | 1/2022 | Lin et al. | |
| 2022/0223774 A1* | 7/2022 | Lim | H05K 1/111 |
| 2023/0009719 A1* | 1/2023 | Chi | H01L 24/13 |
| 2023/0010707 A1* | 1/2023 | Wang | H01L 25/50 |
| 2023/0081487 A1* | 3/2023 | Chae | H01L 25/0753 |
| | | | 257/89 |

FOREIGN PATENT DOCUMENTS

| | | |
|---|---|---|
| CN | 108288661 | 7/2018 |
| CN | 213878148 | 8/2021 |
| TW | 202205666 | 2/2022 |

* cited by examiner

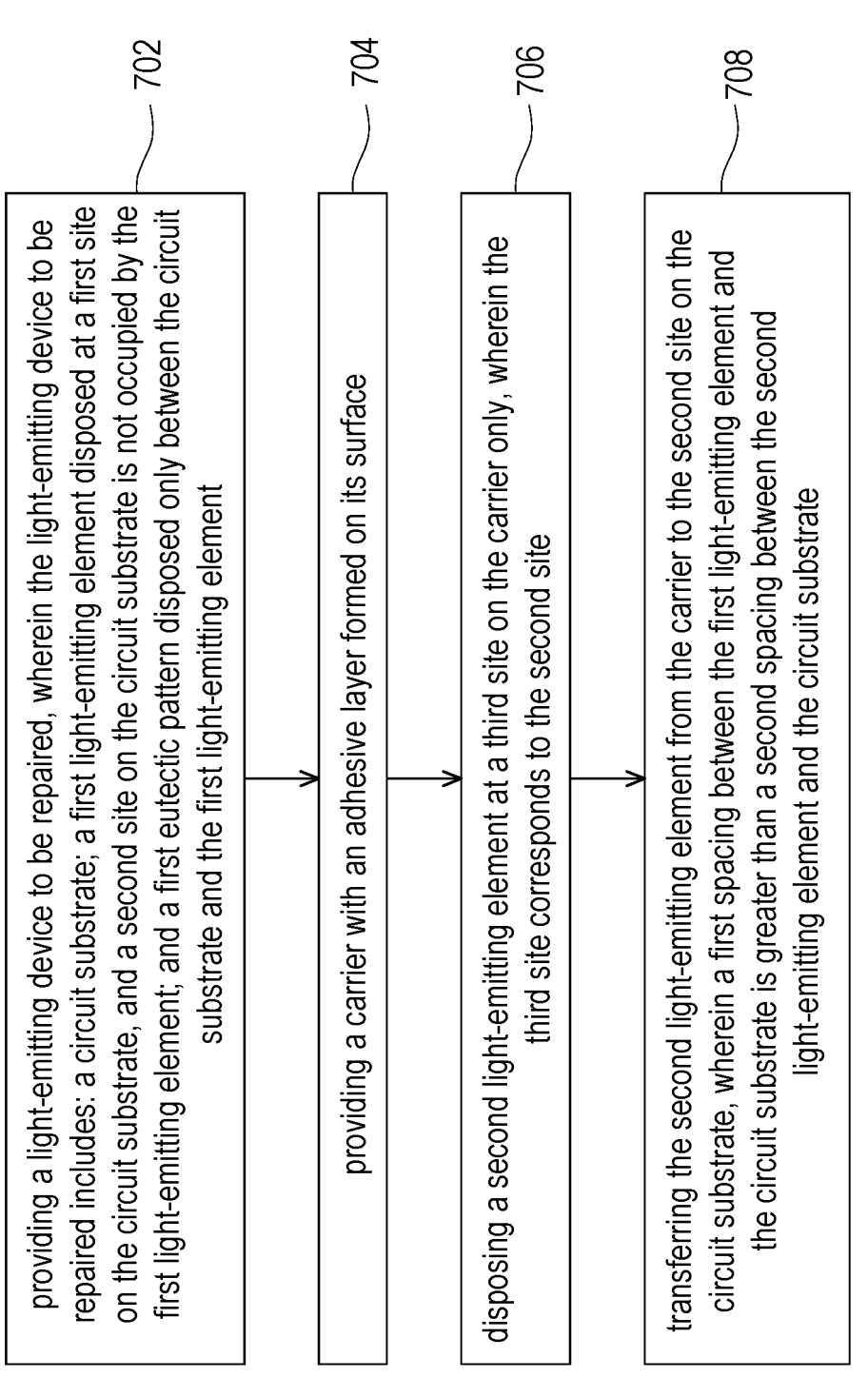

providing a light-emitting device to be repaired, wherein the light-emitting device to be repaired includes: a circuit substrate; a first light-emitting element disposed at a first site on the circuit substrate, and a second site on the circuit substrate is not occupied by the first light-emitting element; and a first eutectic pattern disposed only between the circuit substrate and the first light-emitting element ⌐702 providing a carrier with an adhesive layer formed on its surface ⌐704 disposing a second light-emitting element at a third site on the carrier only, wherein the third site corresponds to the second site ⌐706 transferring the second light-emitting element from the carrier to the second site on the circuit substrate, wherein a first spacing between the first light-emitting element and the circuit substrate is greater than a second spacing between the second light-emitting element and the circuit substrate ⌐708

FIG. 7

LIGHT-EMITTING DEVICE AND METHOD FOR MANUFACTURING THE SAME

CROSS-REFERENCE TO RELATED APPLICATION

This application claims the priority benefits of Taiwan application serial no. 112104373, filed on Feb. 8, 2023 and Taiwan application serial no. 112117876, filed on May 15, 2023. The entirety of each of the above-mentioned patent applications is hereby incorporated by reference herein and made a part of this specification.

BACKGROUND

Technical Field

The present disclosure relates to a photoelectric device and a method for manufacturing the same and, in particular, to a light-emitting device and a method for manufacturing the same.

Description of Related Art

Micro-light-emitting element (such as micro-light-emitting diode, Micro-LED) display device has the advantages of power saving, high efficiency, high brightness and fast response time. Due to the extremely small size of the micro-light-emitting element, currently the method of manufacturing a micro-light-emitting element display device adopts the mass transfer technology, which uses the micro-electromechanical array technology to pick and place the micro-light-emitting elements, thereby transferring a large number of the micro-light-emitting elements to the circuit substrate at one time.

However, after the mass transfer, some of the light-emitting elements might fail to light up. Currently, one of the solutions removes the light-emitting element that cannot be lighted up and the connecting material between the light-emitting element and the circuit substrate, and then mounts a new light-emitting element with the conductive glue for repair. However, during the repair process, the connecting material cannot be removed completely such that the conductive glue cannot function well and the new light-emitting element cannot be connected successfully, resulting in unsatisfactory yield of light-emitting element repair.

SUMMARY

The disclosure provides a light-emitting device with increased yield of light-emitting element repair.

In an embodiment of the disclosure, a light-emitting device is provided. The light-emitting device includes a circuit substrate, a plurality of light-emitting elements, a plurality of metal patterns, a plurality of connectors and a plurality of eutectic patterns. The plurality of light-emitting elements is disposed over the circuit substrate. The plurality of metal patterns is disposed between the plurality of light-emitting elements and the circuit substrate respectively. The plurality of connectors is disposed between the plurality of light-emitting elements and the plurality of metal patterns respectively. The plurality of eutectic patterns is disposed between the plurality of light-emitting elements and the plurality of connectors respectively. A first spacing exists between a first light-emitting element of the plurality of light-emitting elements and the circuit substrate, a second spacing exists between a second light-emitting element of the plurality of light-emitting elements and the circuit substrate, and a difference between the first spacing and the second spacing is equal to a thickness of the eutectic pattern.

In an embodiment of the disclosure, the metal pattern comprises titanium, molybdenum or copper.

In an embodiment of the disclosure, the connector comprises indium, tin, copper, silver, bismuth or an alloy thereof.

In an embodiment of the disclosure, the plurality of connectors has different thicknesses.

In an embodiment of the disclosure, the connector electrically connected to the first light-emitting element has a first thickness, the connector electrically connected to the second light-emitting element has a second thickness, and a difference between the first thickness and the second thickness is equal to the thickness of the eutectic pattern.

In an embodiment of the disclosure, the plurality of eutectic patterns has substantially the same thicknesses.

In an embodiment of the disclosure, the thickness of the eutectic pattern ranges from 0.4 μm to 0.7 μm.

In an embodiment of the disclosure, the light-emitting device further includes a plurality of pads disposed between the plurality of metal patterns and the circuit substrate respectively.

In an embodiment of the disclosure, a light-emitting device is provided. The light-emitting device includes a circuit substrate, a plurality of light-emitting elements, a plurality of connectors and a plurality of eutectic patterns. The plurality of light-emitting elements is disposed over the circuit substrate. The plurality of connectors is disposed between the plurality of light-emitting elements and circuit substrate respectively. The plurality of eutectic patterns is disposed between the plurality of light-emitting elements and the plurality of connectors respectively. A first connector of the plurality of connectors is disposed between a first light-emitting element of the plurality of light-emitting elements and circuit substrate, a second connector of the plurality of connectors is disposed between a second light-emitting element of the plurality of light-emitting elements and circuit substrate, and a thickness of the first connector is equal to a sum of a thickness of the eutectic pattern and a thickness of the second connector.

In an embodiment of the disclosure, the eutectic pattern includes a material of an electrode of the light-emitting element and a material of the connector.

In an embodiment of the disclosure, the light-emitting device further includes a plurality of metal patterns disposed between the plurality of connectors and the circuit substrate respectively.

In an embodiment of the disclosure, the metal pattern has a thickness ranging from 300 Å to 1000 Å.

In an embodiment of the disclosure, a method for manufacturing a light-emitting device is provided. The method includes providing a light-emitting device to be repaired; providing a carrier with an adhesive layer formed on its surface; disposing a second light-emitting element at a third site on the carrier only, wherein the third site corresponds to the second site; and transferring the second light-emitting element from the carrier to the second site on the circuit substrate. The light-emitting device to be repaired includes: a circuit substrate; a first light-emitting element disposed at a first site on the circuit substrate, and a second site on the circuit substrate is not occupied by the first light-emitting element; and a first eutectic pattern disposed only between the circuit substrate and the first light-emitting element. A first spacing between the first light-emitting element and the circuit substrate is greater than a second spacing between the second light-emitting element and the circuit substrate.

In an embodiment of the disclosure, the method further includes removing the first light-emitting element and the first eutectic pattern from the second site on the circuit substrate before providing the light-emitting device to be repaired.

In an embodiment of the disclosure, the light-emitting device to be repaired further includes a plurality of metal patterns and a plurality of first connectors, wherein the first eutectic pattern is disposed between the first light-emitting element and the first connector, and the metal pattern is disposed between the first connector and the circuit substrate.

In an embodiment of the disclosure, the metal pattern and the first connector are further disposed at the second site.

In an embodiment of the disclosure, the method further includes performing a thermal treatment on the second light-emitting element and the circuit substrate to form a second eutectic pattern and a second connector in the first connector disposed at the second site after transferring the second light-emitting element from the carrier to the second site on the circuit substrate.

In an embodiment of the disclosure, a thickness of the first connector is equal to a sum of a thickness of the second eutectic pattern and a thickness of the second connector.

In an embodiment of the disclosure, a thickness of the first eutectic pattern is substantially equal to a thickness of the second eutectic pattern.

In an embodiment of the disclosure, coordinates of the third site correspond to coordinates of the second site.

To make the aforementioned features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 7 is a flowchart illustrating a method for manufacturing a light-emitting device according to an embodiment of the present disclosure.

DESCRIPTION OF THE EMBODIMENTS

Figure 1:
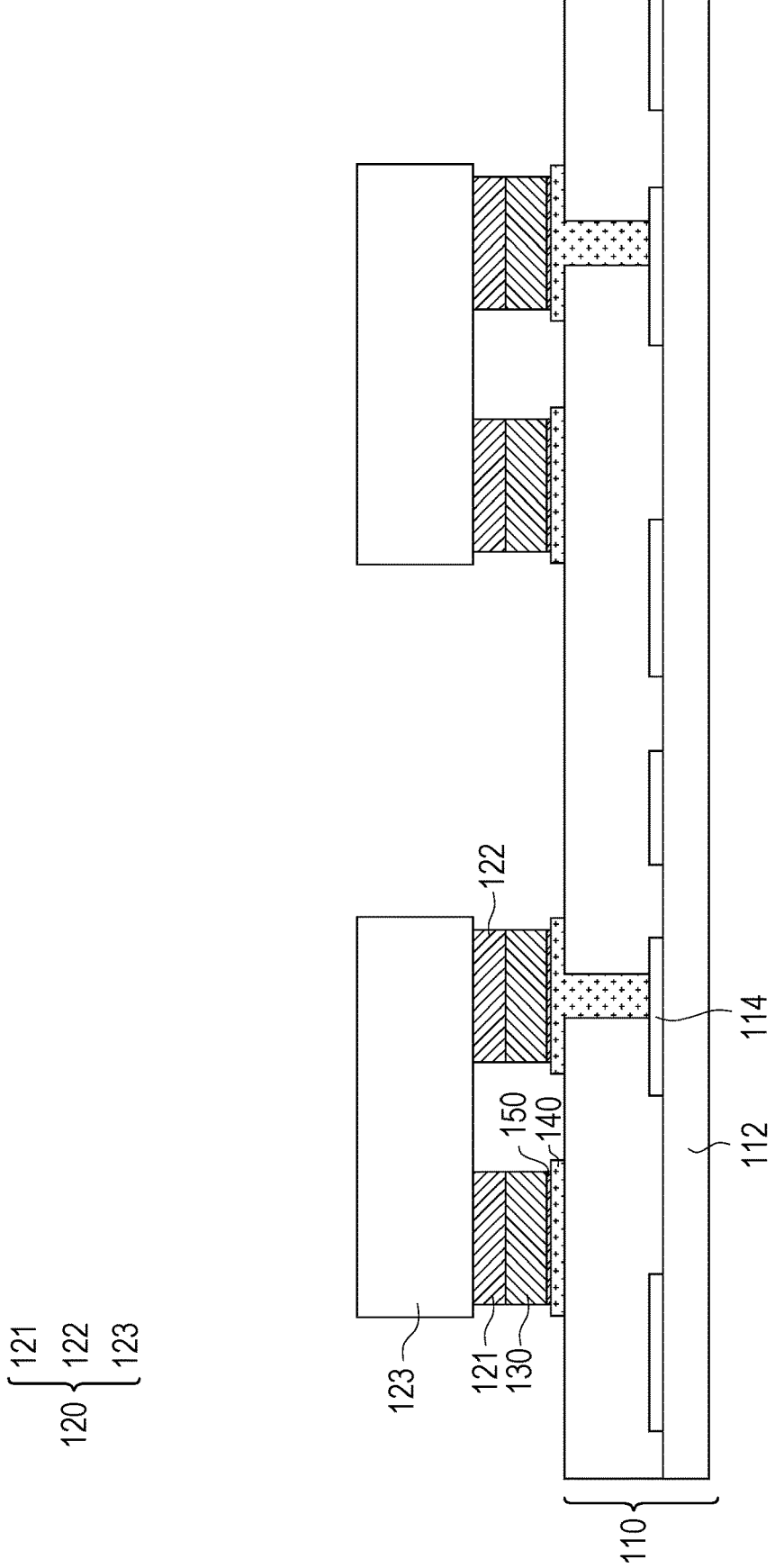
FIG. 1 to FIG. 6 are schematic partial cross-sectional views showing the step flow of a method for manufacturing a light-emitting device according to an embodiment of the present disclosure.

In the drawings, the thickness of layers, films, panels, regions, etc., is exaggerated for clarity. Throughout the specification, the same reference numerals represent the same elements. It should be understood that when an element such as a layer, a film, a region, or a substrate is referred to as being "on" another element or "connected to" another element, the element may be directly on the another element or connected to the another element, or there may be an intermediate element. In contrast, when an element is referred to as being "directly on" another element or "directly connected to" another element, there is no intermediate element. As used herein, "connection" may refer to physical and/or electrical connection. Furthermore, "electrical connection" or "coupling" may be that there is another element between two elements.

It should be understood that although terms such as "first", "second", and "third" may be used herein to describe various elements, components, regions, layers, and/or portions, the elements, components, regions, and/or portions are not limited by the terms. The terms are only used to distinguish one element, component, region, layer, or portion from another element, component, region, layer, or portion. Therefore, a first "element", "component", "region", "layer", or "portion" discussed below may be referred to as a second element, component, region, layer, or portion without departing from the teachings herein.

The terms used herein are only for the purpose of describing specific embodiments and are not limiting. As used herein, unless the content clearly indicates otherwise, the singular forms "a", "one", and "the" are intended to include plural forms, including "at least one" or representing "and/or". As used herein, the term "and/or" includes any and all combinations of one or more of the relevant listed items. It should also be understood that when used in the specification, the terms "containing" and/or "including" designate the presence of the feature, the region, the entirety, the step, the operation, the element, and/or the component, but do not exclude the presence or the addition of one or more other features, regions, entireties, steps, operations, elements, components, and/or combinations thereof.

In addition, relative terms such as "lower" or "bottom" and "upper" or "top" may be used herein to describe the relationship between an element and another element, as shown in the drawings. It should be understood that the relative terms are intended to include different orientations of a device in addition to the orientation shown in the drawings. For example, if the device in a drawing is flipped, an element described as being on the "lower" side of other elements will be oriented on the "upper" side of the other elements. Therefore, the exemplary term "lower" may include the orientations of "lower" and "upper", depending on the specific orientation of the drawing. Similarly, if the device in a drawing is flipped, an element described as being "under" or "below" other elements will be oriented "above" the other elements. Therefore, the exemplary term "under" or "below" may include the orientations of above and below.

Taking into account the measurement in question and the specific amount of measurement-related error (i.e., the limitations of the measurement system), "about", "similar", or "substantially" used in the present specification include the value and the average value within an acceptable deviation range of a specific value confirmed by those having ordinary skill in the art. For example, "about" may represent within one or a plurality of standard deviations of the value, or within ±30%, ±20%, ±10%, or ±5%. Moreover, "about", "similar", or "substantially" used in the present specification may include a more acceptable deviation range or standard deviation according to optical properties, etching properties, or other properties, and one standard deviation does not need to apply to all of the properties.

Unless otherwise defined, all terms (including technical and scientific terms) used herein have the same meaning as commonly understood by persons skilled in the art of the disclosure. It will be further understood that terms such as those defined in commonly used dictionaries should be interpreted as having meanings consistent with the meanings in the related art and the context of the disclosure, and will not be interpreted as having idealized or overly formal meanings unless explicitly defined herein.

The exemplary embodiments are described herein with reference to cross-sectional views that are schematic views of idealized embodiments. Therefore, changes in shapes of illustration as a result of, for example, manufacturing technology and/or tolerances may be expected. Therefore, the embodiments described herein should not be interpreted as being limited to the specific shapes of regions as shown herein, but include, for example, shape deviations caused by manufacturing. For example, a region that is shown or described as flat may generally have rough and/or non-linear features. In addition, an acute angle shown may be rounded. Therefore, the regions shown in the drawings are schematic in nature, and the shapes thereof are not intended to show the precise shapes of the regions and are not intended to limit the scope of the claims.

FIG. 1 to FIG. 6 are schematic partial cross-sectional views showing the step flow of a method for manufacturing a light-emitting device according to an embodiment of the present disclosure. FIG. 7 is a flowchart illustrating a method for manufacturing a light-emitting device according to an embodiment of the present disclosure. Hereinafter, the manufacturing method of the light-emitting device 10 will be described with reference to FIGS. 1 to 7.

First, referring to FIG. 1, multiple light-emitting elements 120 are transferred to a circuit substrate 110. In some embodiments, the light-emitting element 120 is electrically connected to the circuit substrate 110 through the connection layer 130. In some embodiments, the circuit substrate 110 is provided with a plurality of pads 140, and the light-emitting element 120 is electrically connected to the pads 140 on the circuit substrate 110 through the connection layer 130. In some embodiments, each pad 140 is provided with a metal pattern 150, and the light-emitting element 120 is electrically connected to the pad 140 through the connection layer 130 and the metal pattern 150.

In some embodiments, the connection layers 130 are firstly disposed on a first electrode 121 and a second electrode 122 of the light-emitting element 120 respectively, and then the connection layers 130 on the first electrode 121 and the second electrode 122 are connected to the metal patterns 150 on the pads 140 respectively. In some embodiments, the connection layers 130 are disposed on the metal patterns 150 respectively, and then the first electrode 121 and the second electrode 122 are connected to the connection layers 130 on the corresponding metal patterns 150 respectively. In some embodiments, the second electrode 122 of the light-emitting element 120 is electrically connected to a circuit structure 114 of the circuit substrate 110.

In some embodiments, the circuit substrate 110 may include a backing plate 112, and the circuit structure 114 is disposed on the backing plate 112. The backing plate 112 may be a transparent plate or a non-transparent plate, and its material can be quartz, glass, polymer or other suitable materials. The circuit structure 114 may include elements or circuits required by the light-emitting device 10, such as driving elements, switching elements, storage capacitors, power lines, driving signal lines, timing signal lines, current compensation lines, detection signal lines, and the like.

In some embodiments, the light-emitting element 120 includes the first electrode 121, the second electrode 122 and a light-emitting stack 123, and the first electrode 121 and the second electrode 122 can be electrically connected to different layers in the light-emitting stack 123, respectively. In some embodiments, the first electrode 121 and the second electrode 122 are located on the same side of the light-emitting stack 123, but the disclosure is not limited thereto. In some embodiments, the first electrode 121 and the second electrode 122 are located on different sides of the light-emitting stack 123. In some embodiments, the light-emitting element 120 is a lateral micro-light-emitting diode. In some embodiments, the light-emitting element 120 is a vertical micro-light-emitting diode.

In some embodiments, the material of the first electrode 121 or the second electrode 122 includes a metal, an alloy, a nitride of a metal material, an oxide of a metal material, an oxynitride of a metal material or other suitable material, or a stack of a metal material layer and other conductive material layer, or other low resistance material. In some embodiments, the light-emitting stack 123 includes a first-type semiconductor layer, a second-type semiconductor layer, and a light-emitting layer sandwiched between the first-type semiconductor layer and the second-type semiconductor layer. In some embodiments, the first-type semiconductor layer is an N-type doped semiconductor layer, such as an N-type gallium nitride (n-GaN) layer. In some embodiments, the second-type semiconductor layer is a P-type doped semiconductor layer, such as a P-type gallium nitride (p-GaN) layer. In some embodiments, the light-emitting layer has, for example, a multiple quantum well (MQW) structure. In some embodiments, the MQW structure may include multiple layers of indium gallium nitride (InGaN) and multiple layers of gallium nitride (GaN) that are stacked alternately.

In some embodiments, the thickness of the connection layer 130 is about 2 µm to 2.2 µm. In some embodiments, the material of the connection layer 130 includes indium (In), tin (Sn), copper (Cu), silver (Ag), bismuth (Bi) or alloys thereof. In some embodiments, the material of the pad 140 includes indium tin oxide (InSnO), indium zinc oxide (InZnO), aluminum tin oxide (AlSnO), aluminum zinc oxide (AlZnO), indium gallium zinc oxide (InGaZnO), silver nanoparticles or other suitable electrically conductive oxides. In some embodiments, the material of the metal pattern 150 includes titanium (Ti), molybdenum (Mo) or copper.

Figure 2:
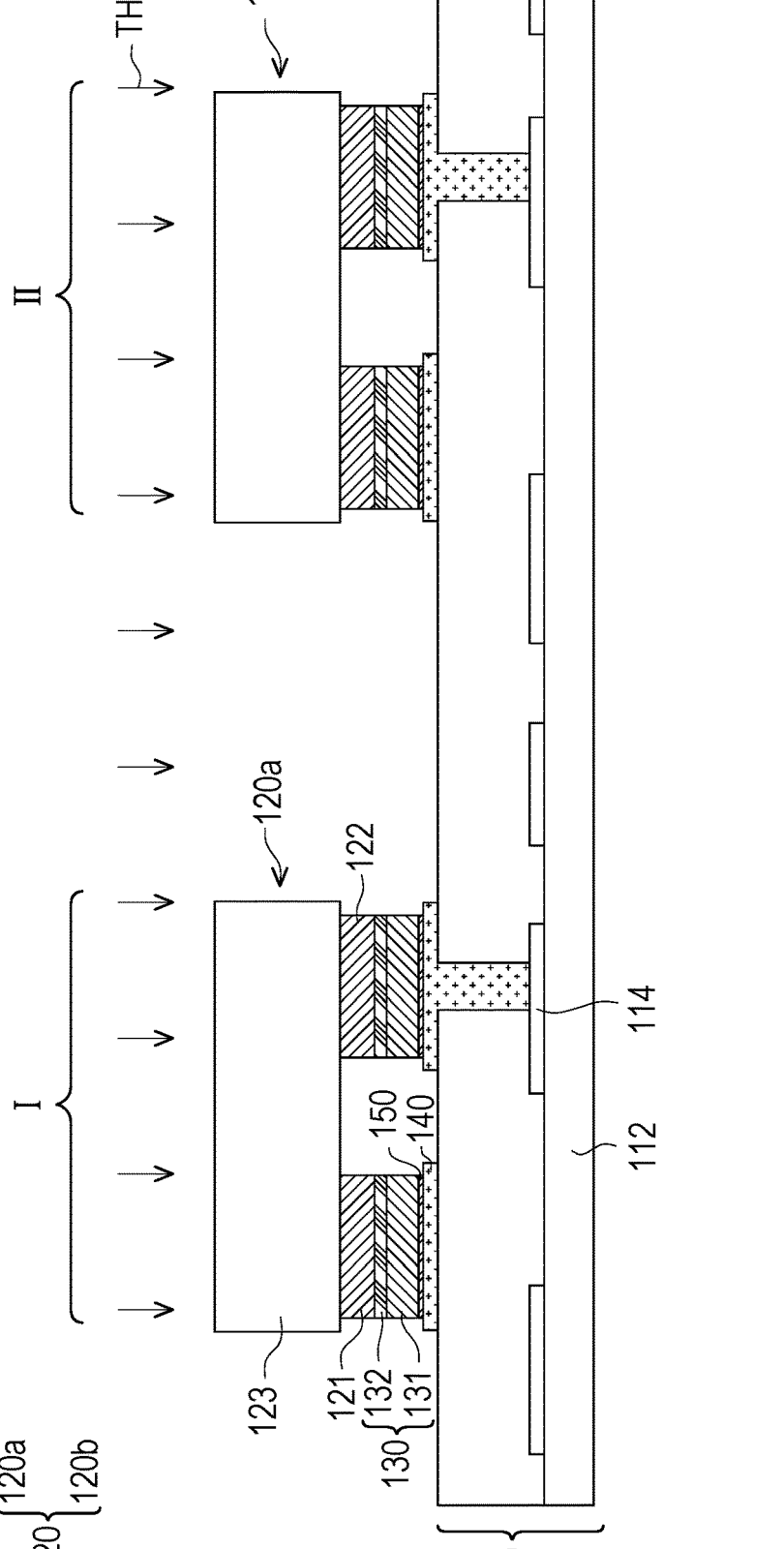

With reference to FIG. 2, after the light-emitting elements 120 have been transferred to the circuit substrate 110, a thermal treatment TH can be performed on the light-emitting element 120 and the circuit substrate 110, so that the materials of the first electrode 121 and the second electrode 122 infiltrate respectively into the corresponding connection layers 130 to form a eutectic pattern 132 in the connection layer 130, and a portion of the connection layer 130 where the eutectic pattern 132 is not formed becomes a connector 131. In other words, after the thermal treatment TH, the connection layer 130 is transformed into the connector 131 and the eutectic pattern 132, wherein the material of the connector 131 is substantially the same as that of the connection layer 130, and the material of the eutectic pattern 132 includes the material of the first electrode 121 or the second electrode 122 and the material of the connection layer 130. In some embodiments, the temperature of the thermal treatment TH ranges from 150° C. to 300° C. In some embodiments, the duration of the thermal treatment TH ranges from 1 minute to 10 minutes.

In some embodiments, the light-emitting element 120 can be tested to confirm whether the light-emitting element 120 can be turned on normally. For example, after testing, it is found that the light-emitting element 120a at site I can be turned on normally, but the light-emitting element 120b at site II cannot be turned on normally.

Figure 3A:
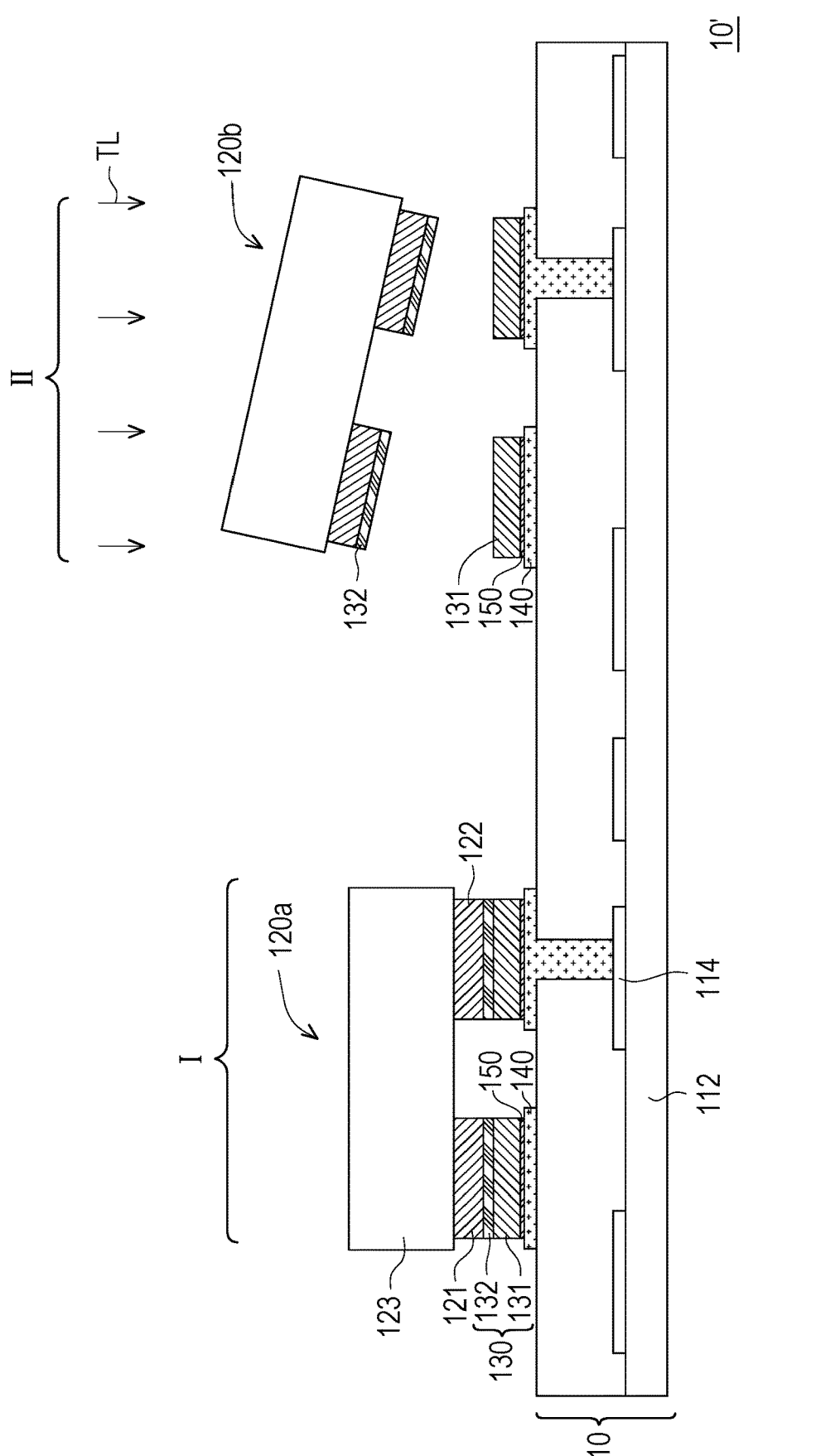

Please refer to FIG. 3a and step 702 in FIG. 7. Next, a laser treatment TL can be performed on the light-emitting element 120b that cannot be turned on normally, so as to remove the light-emitting element 120b and obtain a light-emitting device to be repaired 10'. Since the material of the eutectic pattern 132 is relatively brittle, and the bonding force between the eutectic pattern 132 and the connector 131 is weak, the light-emitting element 120b together with the eutectic pattern 132 will be removed from site II after the laser treatment TL. In some embodiments, the bonding force between the eutectic pattern 132 and the first electrode 121 or the bonding force between the eutectic pattern 132 and the second electrode 122 is greater than the bonding force between the eutectic pattern 132 and the connector 131. In some embodiments, the bonding force between the connector 131 and the metal pattern 150 is greater than the bonding force between the eutectic pattern 132 and the connector 131.

In some embodiments, the light-emitting device to be repaired 10' includes the circuit substrate 110 and the light-emitting element 120a, the light-emitting element 120a is disposed at site I on the circuit substrate 110, and site II on the circuit substrate 110 is not occupied by any light-emitting element. In some embodiments, the light-emitting device to be repaired 10' further includes the metal pattern 150, the connector 131 and the eutectic pattern 132 disposed between the circuit substrate 110 and the light-emitting element 120a. In some embodiments, the connector 131 is disposed between the metal pattern 150 and the eutectic pattern 132, and the eutectic pattern 132 is disposed between the first electrode 121 or the second electrode 122 of the light-emitting element 120a and the corresponding connector 131. In some embodiments, the light-emitting device to be repaired 10' further includes the pad 140, and the pad 140 is disposed between the metal pattern 150 and the circuit substrate 110.

In some embodiments, the light-emitting device to be repaired 10' further includes the metal pattern 150, the pad 140 and the connector 131 disposed at site II on the circuit substrate 110, the metal pattern 150 is disposed between the connector 131 and the circuit substrate 110, and the pad 140 is disposed between the metal pattern 150 and the circuit substrate 110.

Figure 3B:
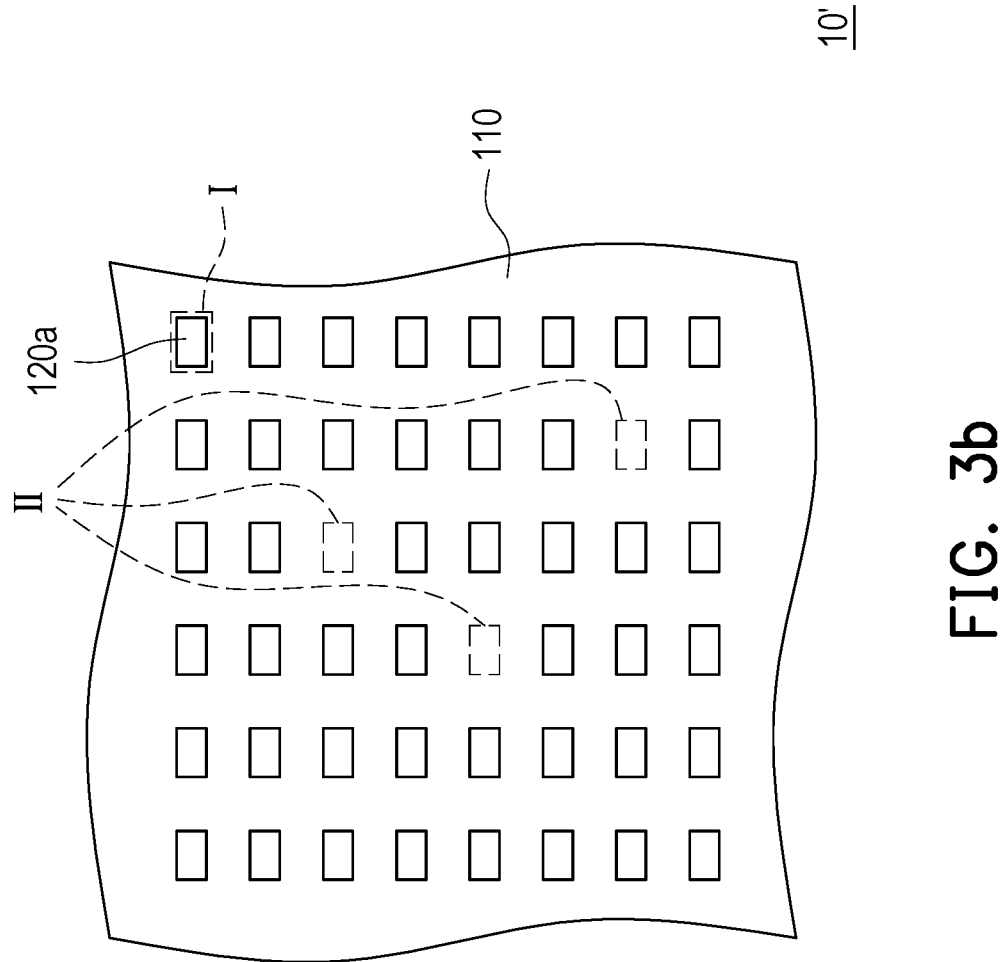

FIG. 3b is a schematic partial top view of the light-emitting device to be repaired 10'. For example, as shown in FIG. 3b, multiple sites I on the circuit substrate 110 are all provided with a light-emitting element 120a, and three sites II on the circuit substrate 110 are not provided with any light-emitting element. The number of site II is not particularly limited and can be changed as needed.

Figure 4:
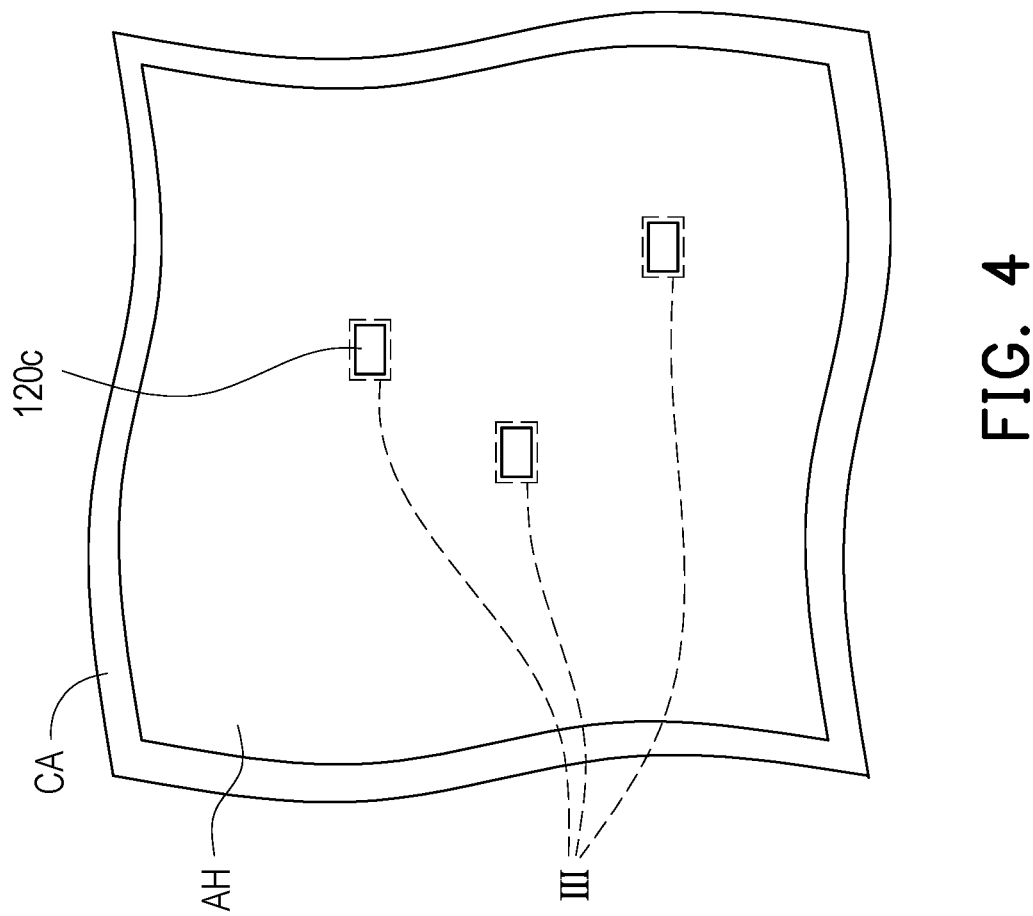

FIG. 4 is a schematic partial top view of a carrier CA with an adhesive layer AH formed on its surface. With reference to FIG. 4 and step 704 in FIG. 7, in some embodiments, providing the carrier CA with the adhesive layer AH formed on its surface can be implemented by forming the adhesive layer AH on the surface of the carrier CA by means of spin coating. In some embodiments, the adhesive layer AH includes an adhesive material such as acrylic resin.

Please refer to step 706 in FIG. 7. Next, the light-emitting elements 120c are disposed only at three site IIIs on the carrier CA respectively, and the three site IIIs on the carrier CA correspond to the three site IIs on the circuit substrate 110 respectively. In some embodiments, the coordinates of the three site IIs on the circuit substrate 110 can be detected, thereby determining the coordinates of the three site IIIs on the carrier CA, and then the light-emitting elements 120c attached to a temporary carrier are transferred to the three site IIIs on the carrier CA. In some embodiments, the coordinates of site III correspond to the coordinates of site II. In some embodiments, a laser lift off process may be used to transfer the light-emitting element 120c attached to the temporary carrier to site III on the carrier CA. The number of site III is not particularly limited, and can be adjusted depending on the number of site II.

Figure 5:
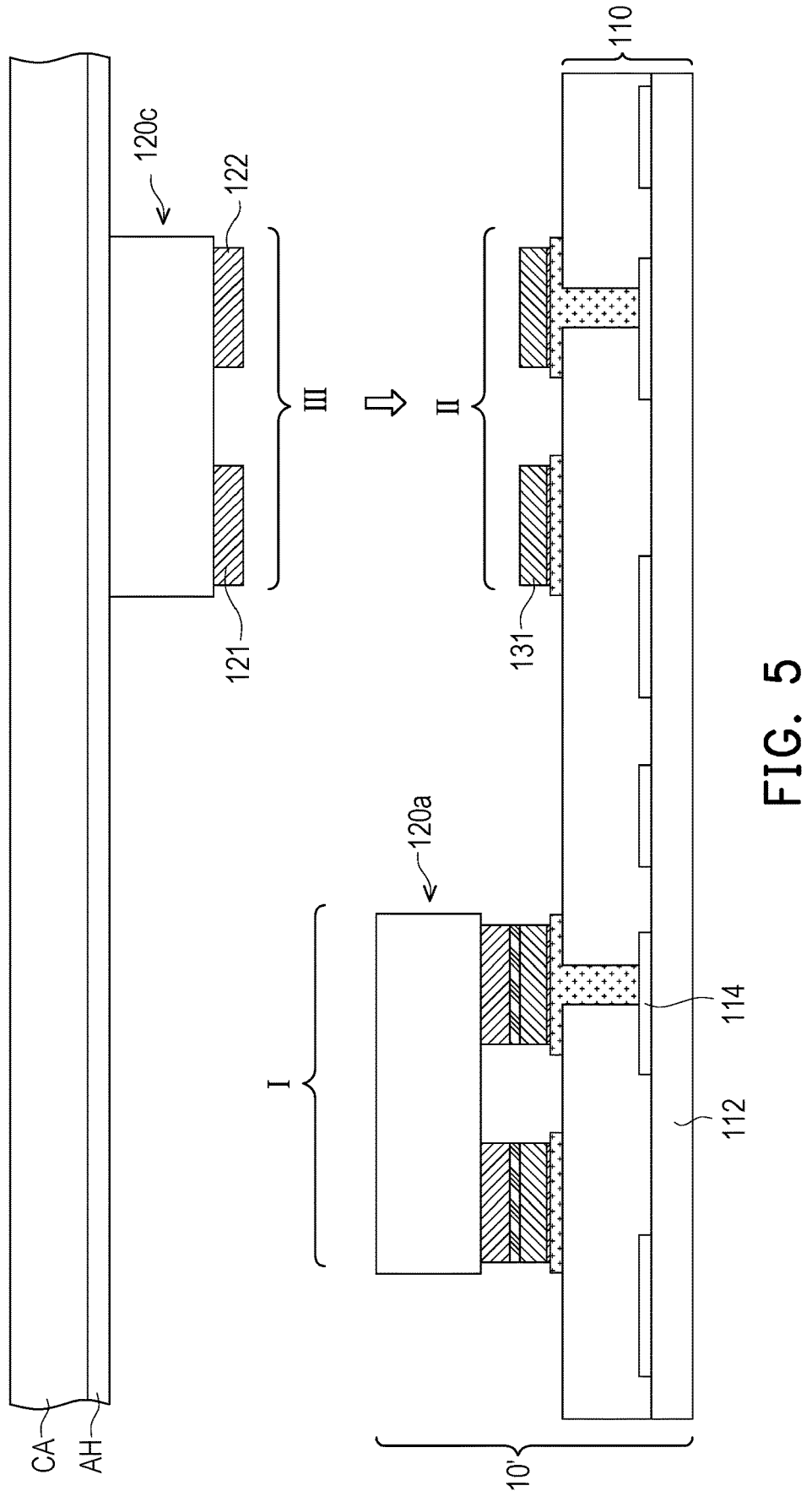
Figure 6:
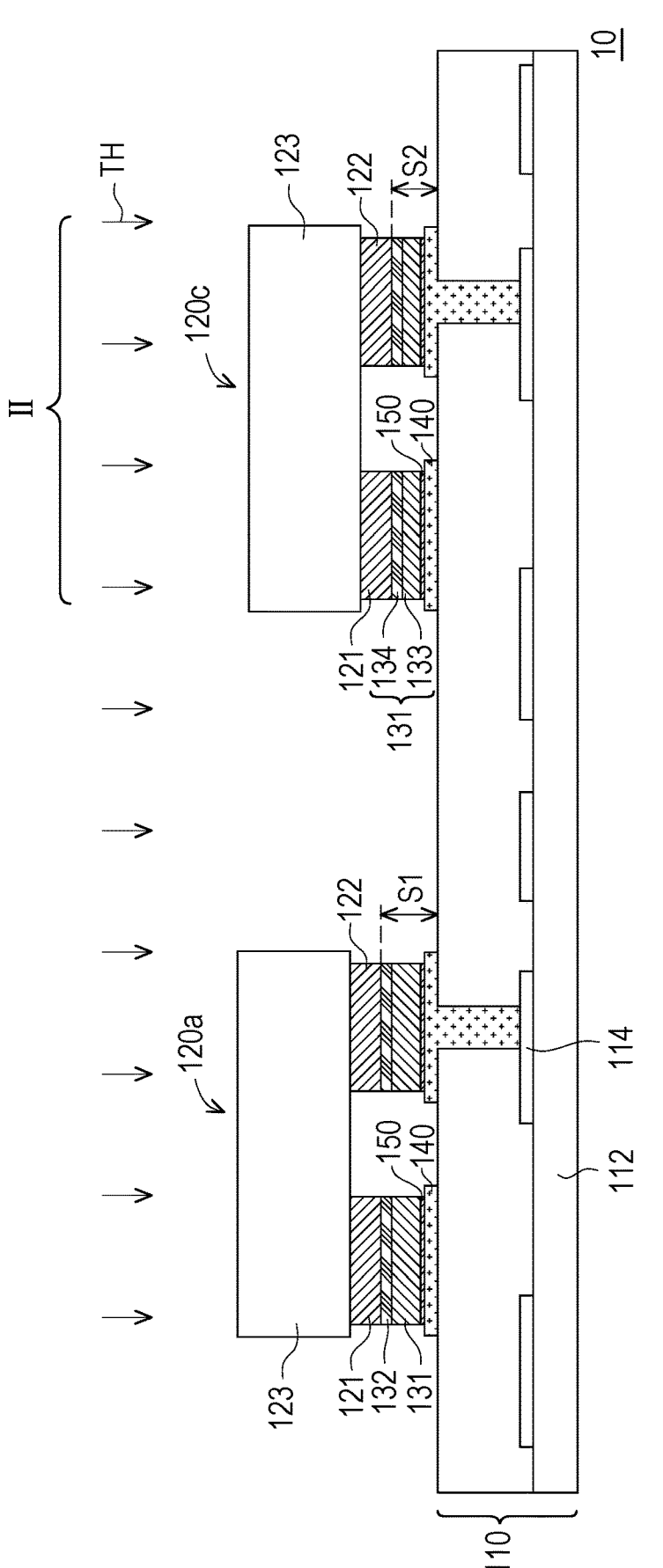

Please refer to FIG. 5 and step 708 in FIG. 7. Next, the light-emitting element 120c at site III on the carrier CA can be transferred to site II on the circuit substrate 110, so as to repair the light-emitting device to be repaired 10', thereby obtaining the light-emitting device 10 as shown in FIG. 6. In some embodiments, the stamping technology can be used to transfer the light-emitting element 120c from site III on the carrier CA to site II on the circuit substrate 110, which not only avoids damage to the light-emitting element 120a at site I on the circuit substrate 110 but also reduces waste of the light-emitting element, compared to the conventional method that uses a carrier carrying a full array of light-emitting elements to repair the light-emitting device to be repaired 10'.

With reference to FIG. 6, in some embodiments, after the first electrode 121 and the second electrode 122 of the light-emitting element 120c respectively fall on the corresponding connectors 131 at site II, the thermal treatment TH can be performed on the light-emitting element 120c and the circuit substrate 110 so that the materials of the first electrode 121 and the second electrode 122 infiltrate into the corresponding connectors 131 respectively to from a eutectic pattern 134 in the connector 131 at site II, and the portion of the connector 131 that does not form the eutectic pattern 134 becomes a connector 133. In other words, after the thermal treatment TH, the connector 131 transforms into the connector 133 and the eutectic pattern 134, wherein the material of the connector 133 is the same as that of the connector 131, and the material of the eutectic pattern 134 includes the material of the first electrode 121 or the second electrode 122 and the material of the connector 131. In some embodiments, the material of the eutectic pattern 134 is substantially the same as that of the eutectic pattern 132. In some embodiments, the thickness of the eutectic pattern 134 is substantially the same as the thickness of the eutectic pattern 132. In some embodiments, the thickness of the connector 131 is substantially equal to the sum of the thickness of the connector 133 and the thickness of the eutectic pattern 134.

In some embodiments, FIG. 6 is a schematic partial cross-sectional view of the light-emitting device 10 according to an embodiment of the present disclosure. The light-emitting device 10 includes: the circuit substrate 110, the light-emitting elements 120a and 120c, the metal patterns 150, the connectors 131 and 133 and the eutectic patterns 132 and 134. The light-emitting elements 120a and 120c are disposed on the circuit substrate 110, and both the light-emitting elements 120a and 120c include the first electrode 121, the second electrode 122 and the light-emitting stack 123. The metal patterns 150 are respectively arranged between the light-emitting elements 120a, 120c and the circuit substrate. The connectors 131 and 133 are respectively arranged between the light-emitting elements 120a and 120c and the metal patterns 150. The eutectic patterns 132 and 134 are respectively disposed between the light-emitting elements 120a and 120c and the connectors 131 and 133.

In some embodiments, the light-emitting device 10 further includes the pads 140, which are respectively located between the metal patterns 150 and the circuit substrate 110. In some embodiments, the eutectic pattern 132, the connector 131, the metal pattern 150 and the pad 140 are disposed between either one of the first electrode 121 and the second electrode 122 of the light-emitting element 120a and the circuit substrate 110. In some embodiments, the eutectic pattern 134, the connector 133, the metal pattern 150 and the pad 140 are disposed between either one of the first electrode 121 and the second electrode 122 of the light-emitting element 120c and the circuit substrate 110.

In some embodiments, there is a spacing S1 between the light-emitting element 120a and the circuit substrate 110, there is a spacing S2 between the light-emitting element 120c and the circuit substrate 110, and the spacing S1 is greater than the spacing S2. In some embodiments, the difference between the spacing S1 and the spacing S2 is the thickness of the eutectic pattern 132 or the eutectic pattern 134.

In some embodiments, the thickness of the connector 131 is different from the thickness of the connector 133. In some embodiments, the difference between the thickness of the connector 131 and the thickness of the connector 133 is the thickness of the eutectic pattern 134. In some embodiments, the difference between the thickness of the connector 131 and the thickness of the connector 133 is the thickness of the eutectic pattern 132. In some embodiments, the thickness of the eutectic pattern 132 or the eutectic pattern 134 ranges from 0.4 μm to 0.7 μm. In some embodiments, the thickness of the connector 131 is about 1.3 μm to 1.8 μm. In some embodiments, a ratio of the thickness of the eutectic pattern 132 to the thickness of the connector 131 ranges from about 22% to 54%. In some embodiments, a ratio of the thickness of the eutectic pattern 134 to the thickness of the connector 133 ranges from about 44% to 117%. In some embodiments, the metal pattern 150 has a thickness of 300 Å to 1000 Å.

To sum up, the light-emitting device of the present disclosure can remove the light-emitting device that cannot be turned on normally together with the eutectic pattern due to the weak bonding force between the eutectic pattern and the connector. In addition, the remaining connector is flat and need not to be removed. When a new light-emitting element is placed for repair later, no conductive glue or connecting material is required, so the repair procedure can be simplified and the repair yield of the -emitting element can be improved at the same time.

Although the disclosure has been described in detail with reference to the above embodiments, the embodiments are not intended to limit the disclosure. Those skilled in the art should understand that it is possible to make changes and modifications without departing from the spirit and scope of the disclosure. Therefore, the protection scope of the disclosure shall be defined by the appended claims.

What is claimed is:

1. A light-emitting device, comprising:
a circuit substrate;
a plurality of light-emitting elements disposed over the circuit substrate;
a plurality of metal patterns disposed between the plurality of light-emitting elements and the circuit substrate respectively;
a plurality of connectors disposed between the plurality of light-emitting elements and the plurality of metal patterns respectively; and
a plurality of eutectic patterns disposed between the plurality of light-emitting elements and the plurality of connectors respectively, wherein a first spacing exists between a first light-emitting element of the plurality of light-emitting elements and the circuit substrate, a second spacing exists between a second light-emitting element of the plurality of light-emitting elements and the circuit substrate, and a difference between the first spacing and the second spacing is equal to a thickness of the eutectic pattern.

2. The light-emitting device of claim 1, wherein the metal pattern comprises titanium, molybdenum or copper.

3. The light-emitting device of claim 1, wherein the connector comprises indium, tin, copper, silver, bismuth or an alloy thereof.

4. The light-emitting device of claim 1, wherein the plurality of connectors has different thicknesses.

5. The light-emitting device of claim 1, wherein the connector electrically connected to the first light-emitting element has a first thickness, the connector electrically connected to the second light-emitting element has a second thickness, and a difference between the first thickness and the second thickness is equal to the thickness of the eutectic pattern.

6. The light-emitting device of claim 1, wherein the plurality of eutectic patterns has substantially the same thicknesses.

7. The light-emitting device of claim 6, wherein the thickness of the eutectic pattern ranges from 0.4 μm to 0.7 μm.

8. The light-emitting device of claim 1, further comprising a plurality of pads disposed between the plurality of metal patterns and the circuit substrate respectively.

9. A light-emitting device, comprising:
a circuit substrate;
a plurality of light-emitting elements disposed over the circuit substrate;
a plurality of connectors disposed between the plurality of light-emitting elements and the circuit substrate respectively; and
a plurality of eutectic patterns disposed between the plurality of light-emitting elements and the plurality of connectors respectively,
wherein a first connector of the plurality of connectors is disposed between a first light-emitting element of the plurality of light-emitting elements and the circuit substrate, a second connector of the plurality of connectors is disposed between a second light-emitting element of the plurality of light-emitting elements and the circuit substrate, both the first connector and the second connector extend continuously between the eutectic patterns and the circuit substrate, and a thickness of the first connector is equal to a sum of a thickness of the eutectic pattern and a thickness of the second connector.

10. The light-emitting device of claim 9, wherein the eutectic pattern includes a material of an electrode of the light-emitting element and a material of the connector.

11. The light-emitting device of claim 9, further comprising a plurality of metal patterns disposed between the plurality of connectors and the circuit substrate respectively.

12. The light-emitting device of claim 11, wherein the metal pattern has a thickness ranging from 300 Å to 1000 Å.

* * * * *